United States Patent
Low et al.

(10) Patent No.: US 7,776,250 B2
(45) Date of Patent: Aug. 17, 2010

(54) IMPRINTED POLYMER SUPPORT

(75) Inventors: Hong Yee Low, Singapore (SG); Suresh Parappuveetil Sarangadharan, Singapore (SG); Yen Peng Kong, Irvine, CA (US); Karan Darmono, Singapore (SG)

(73) Assignee: Agency for Science, Technology and Research, Centros (SG)

( * ) Notice: Subject to any disclaimer, the term of this patent is extended or adjusted under 35 U.S.C. 154(b) by 124 days.

(21) Appl. No.: 11/662,553

(22) PCT Filed: Sep. 15, 2004

(86) PCT No.: PCT/SG2004/000295

§ 371 (c)(1),
(2), (4) Date: Mar. 12, 2007

(87) PCT Pub. No.: WO2006/031197

PCT Pub. Date: Mar. 23, 2006

(65) Prior Publication Data

US 2008/0138580 A1    Jun. 12, 2008

(51) Int. Cl.
*B29C 35/08* (2006.01)
*B29C 43/02* (2006.01)
*B32B 3/00* (2006.01)

(52) U.S. Cl. .................... 264/496; 264/319; 977/887
(58) Field of Classification Search ................ 977/887; 264/293, 319, 240, 238, 132, 496
See application file for complete search history.

(56) References Cited

U.S. PATENT DOCUMENTS

| 4,804,431 | A  | * | 2/1989  | Ribner   | 156/345.29 |
| 2002/0022124 | A1 | * | 2/2002  | Ruoff    | 428/325   |
| 2002/0102312 | A1 |   | 8/2002  | Tepper et al. | |
| 2003/0214073 | A1 | * | 11/2003 | Hohn et al. | 264/272.11 |
| 2004/0007799 | A1 | * | 1/2004  | Choi et al. | 264/494 |

FOREIGN PATENT DOCUMENTS

WO    WO 03/096123 A1    11/2003

OTHER PUBLICATIONS

X.-M. Zhao, Y. Xia, G.M. Whitesides, Fabrication of Three-Dimensional Micro-Structures: Microtransfer Molding, Advanced Materials, vol. 8, No. 10 (1996), pp. 837-840.*
L.-R. Bao, X. Cheng, X.D. Huang, L.J. Guo, S.W. Pang, A.F. Yee, Nanoimprinting over topography and multilayer three-dimensional printing, J. Vac. Sci. Technol. B, vol. 20, No. 6 (Nov./Dec. 2002), pp. 2881-2886.*

(Continued)

*Primary Examiner*—Matthew J. Daniels
(74) *Attorney, Agent, or Firm*—Husch Blackwell Sanders LLP Welsh & Katz

(57) ABSTRACT

There is disclosed an imprinted polymer support for solid phase organic synthesis (SPOS). The polymer support being obtainable from a method that comprises providing a substrate and a mold, the mold having a defined surface pattern. A composition is placed between the defined surface pattern of the mold and the substrate. The composition comprises a polymerisation medium with at least one functional monomer and a free radical initiator. The composition is polymerised to form an array of polymer imprints adhered to the substrate.

17 Claims, 3 Drawing Sheets

OTHER PUBLICATIONS

T. Borzenko et al., "Polymer bonding process for nanolithography," Applied Physics Letters, vol. 79, No. 14, pp. 2246-2248 (American Institute of Physics, Oct. 1, 2001).

Frank Gottschalch et al., "Polymer issues in nanoimprinting technique," Solid-State Electronics, vol. 43, pp. 1079-1083 (Elsevier Science Ltd. 1999).

L.J. Heyderman et al., "Flow behavior of thin polymer films used for hot embossing lithography," Microelectronic Engineering, v. 54, pp. 229-245 (Elsevier Science B.V. 2000).

H.C. Scheer et al., "Problems of the nanoimprinting technique for nanometer scale pattern definition," J.Vac.Sci.Technol. B16 (6), pp. 3917-3921 (American Vacuum Society Nov./Dec. 1998).

S. Zankovych et al., "Nanoimprint lithography: challenges and prospects," Nanotechnology, v. 12, pp. 91-95 (Institute of Physics Publishing Ltd. 2001).

* cited by examiner

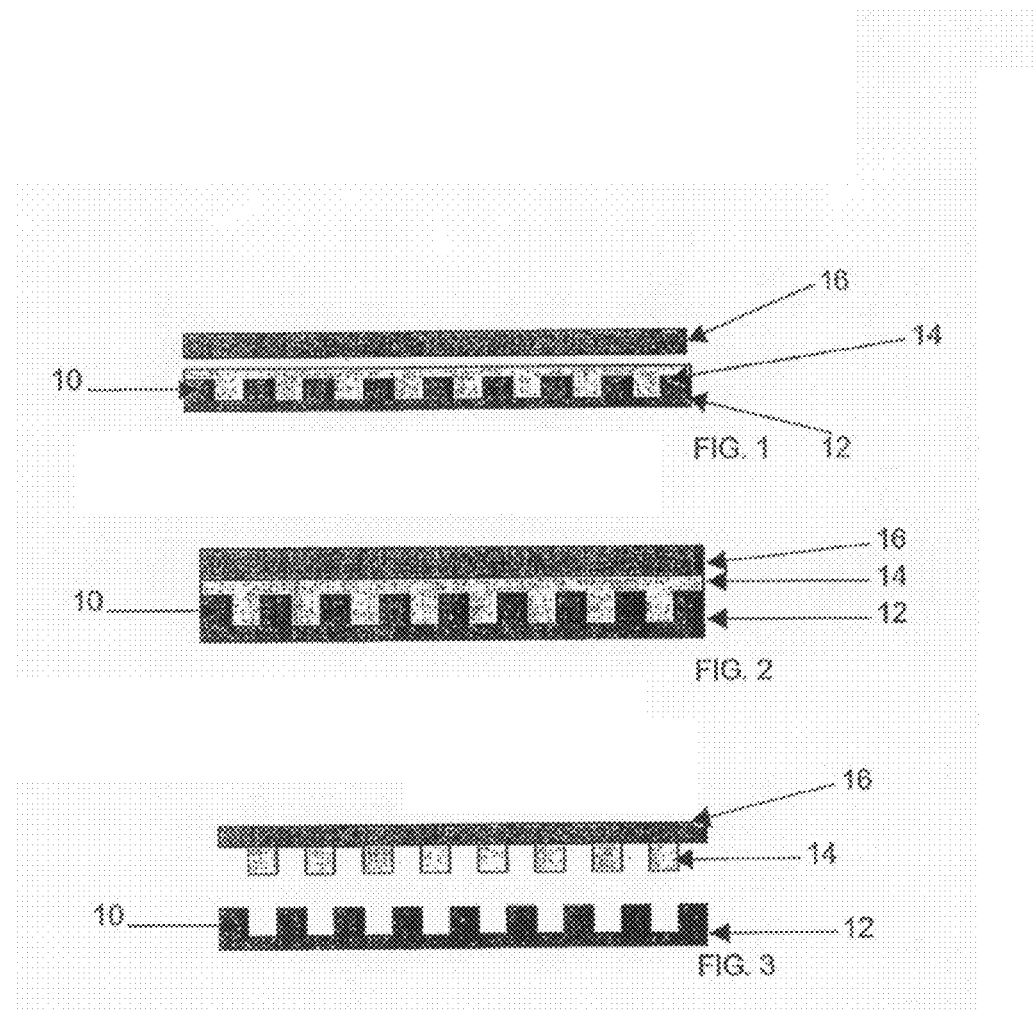

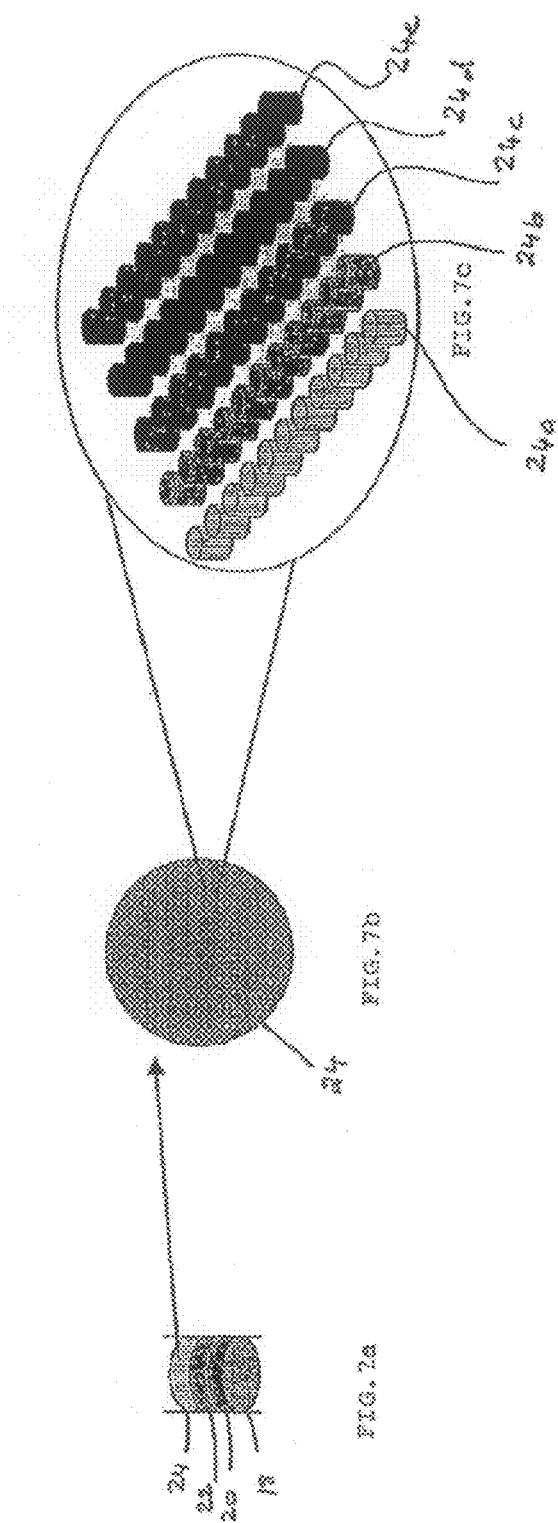

IMPRINTED POLYMER SUPPORT

TECHNICAL FIELD

The present invention generally relates to an imprinted polymer support.

BACKGROUND

Imprinted polymer supports consist of an array of polymer imprints that are adhered to the surface of a substrate. One known method to prepare nano-sized imprinted polymer supports is Nano-Imprint Lithography (NIL). NIL involves providing an imprinting stamp having a plurality of imprint patterns formed thereon. A resin layer is also provided on a solid support substrate. The imprinting stamp is pressed into the resin layer while the resin is polymerised. The imprinting stamp is then removed and the imprint patterns are replicated in the polymer layer. To provide spatially distinct polymer imprints on the substrate, any polymer between the imprint patterns is removed by plasma etching to form spatially distinct polymer imprints on the substrate.

In conventional NIL, a polymer film needs to be spin-coated on the substrate before it can be imprinted by a hard mold. However, spin-coating is rather difficult on flexible substrates such as polymer membranes, which limits the capability of conventional NIL in patterning such substrates. Furthermore, as conventional NIL relies on viscous polymer flow to deform the polymer film and create the thickness contrast, elevated temperatures and pressures are required (L. J. Heyderman, H. Schift, C. David, J. Gobrecht and T. Schweizer, Microelectron. Eng., 54, 229 (2000); H. C. Scheer, H. Schulz, T. Hoffmann and C. M. S. Torres, J. Vac. Sci. Technol. B, 16, 3917 (1998); S. Zankovych, T. Hoffmann, J. Seekamp, J. U. Bruch and C. M. S. Torres, Nanotechnology, 12, (2001)). To achieve reliable pattern transfer, imprinting is typically performed at temperatures between 70 to 900 C above $T_g$ (glass transition temperature) and under pressures as high as 10 MPa (L. J. Heyderman, H. Schift, C. David, J. Gobrecht and T. Schweizer, Microelectron. Eng., 54, 229 (2000); H. C. Scheer, H. Schulz, T. Hoffmann and C. M. S. Torres, J. Vac. Sci. Technol. B, 16, 3917 (1998); F. Gottschalch, T. Hoffmann, C. M. S. Torres, H. Schulz and H. Scheer, Solid-State Electron., 43, 1079 (1999)). Certain modifications to the conventional NIL technique such as the polymer bonding method developed by Borzenko et al (T. Borzenko, M. Tormen, G. Schmidt, L. W. Molenkamp, and H. Janssen, Appl. Phys. Lett., 79, 2246 (2001)) considerably reduce the temperature and pressure requirements. However, the polymer bonding method of Borzenko et al suffers the additional disadvantage of thick residue layer after imprinting, which complicates subsequent pattern transfer.

Imprinted polymer supports can be used in a number of applications. One such application is Solid Phase Organic Synthesis (SPOS). SPOS is an increasingly important technique in the field of organic synthesis, which offers several advantages over traditional synthesis in solution. SPOS is becoming a valuable alternative to traditional synthesis, particularly in applications that require a large number of different compounds in small quantities to be screened. SPOS is also used in combinatorial chemistry and in the production of compound libraries.

Solid phase synthesis uses insoluble support material as carriers for synthetic intermediates. Some of the important factors that affect the efficiency of the support materials are controlled swelling, available surface area, site isolation, chemical and mechanical stability and ease of separation. In addition to the type of polymer used, the geometry of the support material plays an important role to the above-mentioned parameters.

Various techniques have been adopted to identify polymeric supports that are more suitable for SPOS, including grafting to introduce functionality. Functionalised porous polymer beads have also been employed for SPOS, combinatorial chemistry, polymer supported catalysis and ion exchange resins.

One common drawback for the support materials prepared by the known techniques is the lack of design flexibility limited by geometrical constraints. In cross-linked polymer beads, most of the functionality of the beads is in the gel phase and hence the surface area of the beads is not critical. However, the swellability of the polymer is an important factor.

On inorganic supports there is no gel phase and all the active functionalities are immobilized on the surface of the support material. A large surface area will therefore be required to enhance the performance of SPOS by providing more active functionalities. The surface area of a solid particle is controlled by particle size. A larger surface can be achieved by reducing the particle size. However, due to handling problems during product separation, it is not advisable to go below a few microns in size. This is because after solid supported reaction of a product using beads, the beads immobilized with the product are normally separated by filtration. If the particle size of the bead is too small, it is difficult to filter. Centrifugation is also difficult as the polymer beads tend to float due to differences in the density differences.

There is a need to provide a method of producing an imprinted polymer support that overcomes, or at least ameliorates, one or more of the disadvantages described above.

There is a need to provide a method of fabricating nano/micro-sized polymer supports for SPOS which have reduced susceptibility to swelling.

There is a need to provide an array of nano/micro-sized polymer supports on a substrate which are spatially isolated.

SUMMARY OF INVENTION

According to a first aspect of the invention, there is provided a method for forming an imprinted polymer support, the method comprising the steps of:

providing a substrate and a mold, the mold having a defined surface pattern for defining the shape of one or more polymer imprints;

providing a reaction composition on the defined surface pattern of the mold;

polymerising the reaction composition to form the one or more polymer imprints;

contacting the reaction composition on the surface of the substrate during polymerising to adhere the one or more polymer imprints to the surface of the substrate; and separating the mold and the substrate comprising the formed one or more polymer imprints.

According to a second aspect of the invention, there is provided an imprinted polymer support, the imprinted polymer support obtainable from a method comprising the steps of:

providing a substrate and a mold, the mold having a defined surface pattern for defining the shape of one or more polymer imprints;

providing a reaction composition on the defined surface pattern of the mold;

polymerising the reaction composition to form the one or more polymer imprints;

contacting the reaction composition on the surface of the substrate during polymerising to adhere the one or more polymer imprints to the surface of the substrate; and separating the mold and the substrate comprising the formed one or more polymer imprints.

According to a third aspect of the invention, there is provided an array of nano/micro-sized polymer imprints for solid phase organic synthesis (SPOS), the array of nano/micro-sized polymer imprints being supported on a substrate, the array of nano/micro-sized polymer imprints obtainable from a method comprising the steps of:

providing a substrate and a mold, the mold having a defined surface pattern for defining the shape of the array of nano/micro-sized polymer imprints;

providing a reaction composition on the defined surface pattern of the mold;

polymerising the reaction composition to form the array of nano/micro-sized polymer imprints;

contacting the reaction composition on the surface of the substrate during polymerising to adhere the array of nano/micro-sized polymer imprints to the surface of the substrate; and separating the mold and the substrate comprising the formed array of nano/micro-sized polymer imprints.

According to a fourth aspect of the invention, there is provided use of an imprinted polymer support in solid phase organic synthesis, the imprinted polymer support comprising an array of nano/micro-sized cross-linked polymer imprints adhered to a substrate.

DEFINITIONS

The word "obtainable", when used in the description and claims of the specifications is to be interpreted to also mean "obtained".

The word "polymerisable medium", when used in the description and claims of the specifications is to be interpreted broadly to mean a liquid or solid phase that contains a substance that is capable of being polymerised.

As used herein the term "comprising" means "including principally, but not necessarily solely". Variations of the word "comprising", such as "comprise" and "comprises", have correspondingly varied meanings.

As used herein, the term "about", in the context of concentrations of components of the formulations, typically means +/−5% of the stated value, more typically +/−4% of the stated value, more typically +/−3% of the stated value, more typically, +/−2% of the stated value, even more typically +/−1% of the stated value, and even more typically +/−0.5% of the stated value.

Throughout this disclosure, certain embodiments may be disclosed in a range format. It should be understood that the description in range format is merely for convenience and brevity and should not be construed as an inflexible limitation on the scope of the disclosed ranges. Accordingly, the description of a range should be considered to have specifically disclosed all the possible sub-ranges as well as individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

DISCLOSURE OF EMBODIMENTS

Exemplary, non-limiting embodiments of imprinted polymer supports will be disclosed.

In one embodiment, the step of providing the reaction composition comprises selecting a polymerisable medium with at least one functional monomer and a free radical initiator.

In one embodiment, the method may further comprise, after separating the mold from the substrate, the steps of:

providing additional reaction composition on the defined surface pattern of the mold;

contacting the additional reaction composition on the surface of the formed one or more polymer imprints adhered to the substrate; and polymerising the additional reaction composition to form an additional polymer layer on the surface of the formed one or more polymer imprints.

The step of providing additional reaction composition may comprise selecting functional monomers in the additional reaction composition that have different functionality to the reaction composition.

In one embodiment, the step of providing the reaction composition comprises:

selecting a first polymerisable medium with at least one functional monomer and a free radical initiator on a first portion of the defined surface pattern of the mold; and selecting a second polymerisable medium with at least one functional monomer and a free radical initiator on a second portion of the defined surface pattern of the mold, wherein the functionality of the monomers of the first and second polymerisable mediums are different.

In one embodiment, the imprinted polymer supports may be used for solid phase organic synthesis (SPOS).

In one embodiment, the method may further include the step of cross-linking the functional monomers. The cross-linked polymers enhance the strength of the formed polymer imprints.

The polymerising step includes forming an array of spatially distinct polymer imprints.

The defined surface pattern of the mold may be an array of circular cavities to form an array of spatially distinct polymer dots on the substrate during the polymerising step. In one embodiment, the array of polymer dots may be located on the surface of a planar substrate.

The one or more polymer dots may have a diameter in the size range selected from the group consisting of: 5 nm to 1000 nm; 10 nm to 500 nm; 15 nm to 400 nm; 20 nm to 300 nm; 25 nm to 200 nm; 30 nm to 150 nm; and 30 nm to 100 nm.

Each of the spatially distinct polymer imprints may be comprised of polymers having different functional groups.

The substrate may be comprised of an organic material, such as a polymer, or an inorganic material, such as metal. The substrate may be planar or non-planar. Exemplary substrate materials include silicon, glass, quartz, mica, ceramics, polymers such as polyethylene, polypropylene, polyesters such as polyethylene terephthalate, polybutylene terephthalate, polyamides, fluoropolymers and polysulphone and metals such as gold, silver, copper.

Any monomers capable of producing polymers suitable for SPOS may be used, such as acrylates, vinyl or methacrylic monomers. Exemplary monomers and comonomers may be monomers selected from the group consisting of: methyl-methacrylate, other alkyl methacrylates, alkylacrylates, aryl acrylates and methacrylates, cyanoacrylate, styrene, alpha-methyl styrene, vinyl esters, including vinyl acetate, vinyl chloride, methyl vinyl ketone, vinylidene chloride, acrylamide, methacrylamide, acrylonitrile, methacrylonitrile, 2-acetamido acrylic acid; 2-(acetoxyacetoxy)ethyl methacrylate 1-acetoxy-1,3-butadiene; 2-acetoxy-3-butenenitrile; 4-acetoxystyrene; acrolein; acrolein diethyl acetal; acrolein dimethyl acetal; acrylamide; 2-acrylamidoglycolic acid; 2-acrylamido-2-methyl propane sulfonic acid; acrylic acid; acrylic anhydride; acrylonitrile; acryloyl chloride; (R)-α-acryloxy-β,β'-dimethyl-g-butyrolactone; N-acryloxy succinimide N-acryloxytris(hydroxymethyl) aminomethane; N-acryloly chloride; N-acryloyl pyrrolidinone; N-acryloyl-tris(hydroxymethyl)amino methane; 2-amino ethyl methacrylate; N-(3-aminopropyl)methacrylamide; (o, m, or p)-amino-styrene; t-amyl methacrylate; 2-(1-aziridinyl)ethyl methacrylate; 2,2'-azobis-(2-amidinopropane); 2,2'-azobisisobutyronitrile; 4,4'-azobis-(4-cyanovaleric acid); 1,1'-azobis-(cyclohexanecarbonitrile); 2,2'-azobis-(2,4-dimethylvaleronitrile); 4-benzyloxy-3-methoxystyrene; 2-bromoacrylic acid; 4-bromo-1-butene; 3-bromo-3,3-difluoropropane; 6-bromo-1-hexene; 3-bromo-2-methacrylonitrile; 2-(bromomethyl)acrylic acid; 8-bromo-1-octene; 5-bromo-1-pentene; cis-1-bromo-1-propene; beta.-bromostyrene; p-bromostyrene; bromotrifluoro ethylene; (+/−)-3-buten-2-ol; 1,3-butadiene; 1,3-butadiene-1,4-dicarboxylic acid 3-butenal diethyl acetal; 1-butene; 3-buten-2-ol; 3-butenyl chloroformate; 2-butylacrolein; N-t-butylacrylamide; butyl acrylate; butyl methacrylate; (o,m,p)-bromostyrene; t-butyl acrylate; (R)-carvone; (S)-carvone; (−)-carvyl acetate; cis 3-chloroacrylic acid; 2 -chloroacrylonitrile; 2-chloroethyl vinyl ether; 2-chloromethyl-3-trimethylsilyl-1-propene; 3-chloro-1-butene; 3-chloro-2-chloromethyl-1-propene; 3-chloro-2-methyl propene; 2,2-bis(4-chlorophenyl)-1,1-dichloroethylene; 3-chloro-1-phenyl-1-propene; m-chlorostyrene; o-chlorostyrene; p-chlorostyrene; 1-cyanovinyl acetate; 1-cyclopropyl-1-(trimethylsiloxy)ethylene; 2,3-dichloro-1-propene; 2,6-dichlorostyrene; 1,3-dichloropropene; 2,4-diethyl-2,6-heptadienal; 1,9-decadiene; 1-decene; 1,2-dibromoethylene; 1,1-dichloro-2,2-difluoroethylene; 1,1-dichloropropene; 2,6-difluorostyrene; dihydrocarveol; (+/−)dihydrocarvone; (−)-dihydrocarvyl acetate; 3,3-dimethylacrylaldehyde; N,N'-dimethylacrylamide; 3,3-dimethylacrylic acid; 3,3-dimethylacryloyl chloride; 2,3-dimethyl-1-butene; 3,3-dimethyl-1-butene; 2-dimethyl aminoethyl methacrylate; 2,4-dimethyl-2,6-heptadien-1-ol; 2,4-dimethyl-2,6-heptadienal; 2,5-dimethyl-1,5-hexadiene; 2,4-dimethyl-1,3-pentadiene; 2,2-dimethyl-4-pentenal; 2,4-dimethylstyrene; 2,5-dimethylstryene; 3,4-dimethylstryene; divinyl benzene; 1,3-divinyltetramethyl disiloxane; 8,13-divinyl-3,7,12,17-tetramethyl-21H,23H-porphine; 8,13-divinyl-3,7,12,17-tetramethyl-21H,23H-propionic acid; 8,13-divinyl-3,7,12,17-tetramethyl-21H,23H-propionic acid disodium salt; 3,9-divinyl-2,4,8,10-tetraoraspiro[5,5]undecane; divinyl tin dichloride; 1-dodecene; 3,4-epoxy-1-butene; 2-ethyl acrolein; ethyl acrylate; 2-ethyl-1-butene; (+/−)-2-ethylhexyl acrylate; (+/−)-2-ethylhexyl methacrylate; 2-ethyl-2-(hydroxymethyl)-1,3-propanediol triacrylate; 2-ethyl-2-(hydroxymethyl)-1,3-propanediol trimethacrylate; ethyl methacrylate; ethyl vinyl ether; ethyl vinyl ketone; ethyl vinyl sulfone; (1-ethylvinyl)tributyl tin; m-fluorostyrene; o-fluorostyrene; p-fluorostyrene; glycol methacrylate (hydroxyethyl methacrylate); 1,6-heptadiene; 1,6-heptadienoic acid; 1,6-heptadien-4-ol; 1-heptene; 1-hexen-3-ol; 1-hexene; hexafluoropropene; 1,6-hexanediol diacrylate; 1-hexadecene; 1,5-hexadien-3,4-diol; 1,4-hexadiene; 1,5-hexadien-3-ol; 1,3,5-hexatriene; 5-hexen-1,2-diol; 5-hexen-1-ol; hydroxypropyl acrylate; 3-hydroxy-3,7,11-trimethyl-1,6,10-dodecatriene; isoamyl methacrylate; isobutyl methacrylate; isoprene; 2-isopropenylaniline; isopropenyl chloroformate; 4,4'-isopropylidene dimethacrylate; 3-isopropyl-a-a-dimethylbenzene isocyanate; isopulegol; itaconic acid; itaconalyl chloride; lead (II) acrylate; linalyl acetate; p-mentha-1,8-diene; p-mentha-6,8-dien-2-ol; methyleneamino acetonitrile; methacrolein; [3-(methacryloylamino)-propyl]trimethylammonium chloride; methacrylamide; methacrylic acid; methacrylic anhydride; methacrylonitrile; methacryloyl chloride; 2-(methacryloyloxy)ethyl acetoacetate; (3-methacryloxypropyl)trimethoxy silane; 2-(methacryloxy)ethyl trimethyl ammonium methylsulfate; 2-methoxy propene (isopropenyl methyl ether); methyl-2-(bromomethyl)acrylate; 5-methyl-5-hexen-2-one; methyl methacrylate; N,N'-methylene bisacrylamide; 2-methylene glutaronitrite; 2-methylene-1,3-propanediol; 3-methyl-1,2-butadiene; 2-methyl-1-butene; 3-methyl-1-butene; 3-methyl-1-buten-1-ol; 2-methyl-1-buten-3-yne; 2-methyl-1,5-heptadiene; 2-methyl-1-heptene; 2-methyl-1-hexene; 3-methyl-1,3-pentadiene; 2-methyl-1,4-pentadiene; (+/−)-3-methyl-1-pentene; (+/−)-4-methyl-1-pentene; (+/−)-3-methyl-1-penten-3-ol; 2-methyl-1-pentene; α-methyl styrene; t-β-methylstyrene; t-β-methylstyrene; 3-methylstyrene; methyl vinyl ether; methyl vinyl ketone; methyl-2-vinyloxirane; 4-methylstyrene; methyl vinyl sulfonee; 4-methyl5-vinylthiazole; myrcene; t-β-nitrostyrene; 3-nitrostyrene; 1-nonadecene; 1,8-nonadiene; 1-octadecene; 1,7-octadiene; 7-octene-1,2-diol; 1-octene; 1-octen-3-ol; 1-pentadecene; 1-pentene; 1-penten-3-ol; t-2,4-pentenoic acid; 1,3-pentadiene; 1,4-pentadiene; 1,4-pentadien-3-ol; 4-penten-1-ol; 4-penten-2-ol; 4-phenyl-1-butene; phenyl vinyl sulfide; phenyl vinyl sulfonate; 2-propene-1-sulfonic acid sodium salt; phenyl vinyl sulfoxide; 1-phenyl-1-(trimethylsiloxy)ethylene; propene; safrole; styrene (vinyl benzene); 4-styrene sulfonic acid sodium salt; styrene sulfonyl chloride; 3-sulfopropyl acrylate potassium salt; 3-sulfopropyl methacrylate sodium salt; tetrachloroethylene; tetracyano ethylene; tetramethyldivinyl siloxane; trans 3-chloroacrylic acid; 2-trifluoromethyl propene; 2-(trifluoromethyl)propenoic acid; 2,4,4'-trimethyl-1-pentene; 3,5-bis(trifluoromethyl)styrene; 2,3-bis(trimethylsiloxy)-1,3-butadiene; 1-undecene; vinyl acetate; vinyl acetic acid; 4-vinyl anisole; 9-vinyl anthracene; vinyl behenate; vinyl benzoate; 4-vinyl benzoic acid; vinyl benzyl acetate; vinyl benzyl alcohol; 3-vinyl benzyl chloride; 3-(vinyl benzyl)-2-chloroethyl sulfone; 4-(vinyl benzyl)-2-chloroethyl sulfone; N-(p-vinyl benzyl)-N,N'-dimethyl amine; 4-vinyl biphenyl (4-phenyl styrene); vinyl bromide; 2-vinyl butane; vinyl butyl ether; 9-vinyl carbazole; vinyl carbinol; vinyl cetyl ether; vinyl chloroacetate; vinyl chloroformate; vinyl crotanoate; vinyl cyclohexane; 4-vinyl-1-cyclohexene; 4-vinylcyclohexene dioxide; vinyl cyclopentene; vinyl dimethylchlorosilane; vinyl dimethylethoxysilane; vinyl diphenylphosphine; vinyl 2-ethyl hexanoate; vinyl 2-ethylhexyl ether; vinyl ether ketone; vinyl ethylene; vinyl ethylene iron tricarbonyl; vinyl ferrocene; vinyl formate; vinyl hexadecyl ether; vinylidene fluoride; 1-vinyl imidizole; vinyl iodide; vinyl laurate; vinyl magnesium bromide; vinyl mesitylene; vinyl 2-methoxy ethyl ether; vinyl methyl dichlorosilane; vinyl methyl ether; vinyl methyl ketone; 2-vinyl naphthalene; 5-vinyl-2-norbornene; vinyl pelargonate; vinyl phenyl acetate; vinyl phosphonic acid, bis (2-chloroethyl)ester; vinyl propionate; 4-vinyl pyridine; 2-vinyl pyridine; 1-vinyl-2-pyrrolidinone; 2-vinyl quinoline; 1-vinyl silatrane; vinyl sulfone; vinyl sulfone (divinylsulfone); vinyl sulfonic acid sodium salt; o-vinyl toluene; p-vinyl toluene; vinyl triacetoxysilane; vinyl tributyl tin; vinyl trichloride; vinyl trichlorosilane; vinyl trichlorosilane (trichlorovinylsilane); vinyl triethoxysilane; vinyl triethylsilane; vinyl trifluoroacetate; vinyl trimethoxy silane; vinyl trimethyl nonylether; vinyl trimethyl silane; vinyl triphenyphosphonium bromide (triphenyl vinyl phosphonium bromide); vinyl tris-(2-methoxyethoxy)silane; 4-vinylbenzylchloride, 4-vinylbenzyl bromide, 4-vinylbenzaldehyde, 4-aminomethylstyrene, and vinyl 2-valerate.

The monomers may comprise an excess of cross-linking monomers that lend rigidity to the imprinted polymer and include di-, tri- and tetrafunctional acrylates or methacrylates, divinylbenzene (DVB), alkylene glycol and polyalkylene glycol diacrylates and methacrylates, including ethylene glycol dimethacrylate (EGDMA) and ethylene glycol diacrylate, vinyl or allyl acrylates or methacrylates, divinylbenzene, diallyldiglycol dicarbonate, diallyl maleate, diallyl fumarate, diallyl itaconate, vinyl esters such as divinyl oxalate, divinyl malonate, diallyl succinate, triallyl isocyanurate, the dimethacrylates or diacrylates of bis-phenol A or ethoxylated bis-phenol A, methylene or polymethylene bisacrylamide or bismethacrylamide, including hexamethylene bisacrylamide or hexamethylene bismethacrylamide, di(alkene) tertiary amines, trimethylol propane triacrylate, pentaerythritol tetraacrylate, divinyl ether, divinyl sulfone, diallyl phthalate, triallyl melamine, 2-isocyanatoethyl methacrylate, 2-isocyanatoethylacrylate, 3-isocyanatopropylacrylate, 1-methy:L-2-isocyanatoethyl methacrylate, 1,1-dimethyl-2-isocyanaotoethyl acrylate, tetraethylene glycol diacrylate, tetraethylene glycol dimethacrylate, triethylene glycol diacrylate, triethylene glycol dimethacrylate, hexanediol dimethacrylate, and hexanediol diacrylate.

The excess amount of cross-linking agent to functional monomer by weight may be selected from the group consisting of: 0.5% to 50%; 1% to 45%; 5% to 40%; 10% to 40%; 15% to 35%; and 20% to 30.

The free radical initiator may be an ultra-violet (UV) or thermal free radical initiator. Exemplary free radical initiators may be selected from the group consisting of benzoyl peroxide, acetyl peroxide, lauryl peroxide, azobisisobutyronitrile, t-butyl peracetate, cumyl peroxide, t-butyl peroxide, t-butyl hydroperoxide, bis(isopropyl)peroxy-dicarbonate, benzoin methyl ether, 2,2'-azobis(2,4-dimethylvaleronitrile), tertiarybutyl peroctoate, phthalic peroxide, diethoxyacetophenone, and tertiarybutyl peroxypivalate, diethoxyacetophenone, 1-hydroxycyclohexyl phenyl ketone, 2,2-dimethyoxy-2-phenyl-acetophenone, and phenothiazine, and diisopropylxanthogen disulfide.

The choice of monomer, co-monomer and cross-linker will be determined by the chemical and physical properties of the desired resultant polymer for SPOS.

The method may further comprise the step of applying an anti-stiction agent onto the defined surface pattern of the mold. Exemplary anti-stiction agents may be selected from the group consisting of diamond, diamond-like carbon, silicon carbide, vapor phase deposited fluorinated polymer, a self-assembled monolayer comprising silane coupling agents such as dichlorodimethylsilane, octadecyltrichlosilane, dodecyltrichlorosilane, or perfluorodecyltrichlorosilane, and alkanethiols. In one embodiment, the anti-stiction agent is IH, IH,2H,2H-perfluorodecyltrichlorosilane.

The method may further comprise the step of applying a plasma gas onto the surface of the substrate to which the polymer imprints adhere. The plasma gas may be applied as a cleaning agent of the surface of the substrate to aide in adhesion to the polymerised composition. Exemplary gasses that may be used include oxygen, halides such as fluorine and chlorine and noble gasses such as argon and mixtures thereof.

The method may further comprise the step of applying a coupling agent to assist in adhering the polymer imprints to the substrate. The coupling agent may be a silane-based coupling agent. The choice of silane coupling depends on the chemistry of the substrate and the imprinted polymer. Exemplary silane-based coupling agents may be selected from the list consisting of methyltrimethoxysilane, ethyltrimethoxysilane, propyltrimethoxysilane, butyltrimethoxysilane, dimethyldimethoxysilane, diethyldimethoxysilane, vinyltriethoxysilane, vinyltrimethoxysilane, trimethylmethoxysilane, triethylmethoxysilane, vinyltris(methoxyethoxy)silane, trimethylchlorosilane, trimethylaminosilane, glycidoxypropyltrimethoxysilane, glycidoxypropylmethyldiethoxysilane, (epoxycyclohexyl)ethyltrimethoxysilane, methacryloxypropyltrimethoxysilane, methacryloxypropyltriethoxysilane, divinyldimethoxysilane and chloropropyltrimethoxysilane, triethoxysilane, vinyltris(β-methoxyethoxy)silane, γ-methacryloxypropyltrimethoxysilane, γ-glycidoxypropyltrimethoxysilane, β-(1,1-epoxycyclohexyl)ethyltrimethoxysilane, n-β-(aminoethyl)-γ-aminopropyltrimethoxysilane, N-β-(aminoethyl)-γ-aminopropylmethyldimethoxysilane, γ-aminopropyltriethoxysilane, N-phenyl-γ-aminopropyltrimethoxysilane, γ-mercaptopropyltrimethoxysilane, γ-chloropropyltrimethoxysilane, γ-aminopropyltrimethoxysilane, γ-aminopropyl-tris(2-methoxy-ethoxy)silane, N-methyl-γ-aminopropyltrimethoxysilane, N-vinylbenzyl-γ-aminopropyltriethoxysilane, triaminopropyltrimethoxysilane, 3-ureidopropyltrimethoxysilane, 3-4,5-dihydroimidazolepropyltriethoxysilane, hexamethyldisilazane, N,O-(bistrimethylsilyl)amide and N,N-bis(trimethylsilyl)urea; aminosilane, epoxysilanes, phenethylmethyldichlorosilane, divinyldichlorosilane and trivinylmethoxysilane. Exemplary aminosilane and epoxysilanes are γ-aminopropyltriethoxysilane, N-β-(aminoethyl)-γ-aminopropyltriethoxysilane, γ-glycidoxypropyltrimethoxysilane, and β-(3,4-epoxycyclohexyl)ethyltrimethoxysilane.

Advantageously, in one embodiment, the reaction composition does not include an organic solvent.

The polymerising step may be controlled according to one or more controlled conditions selected from the group of pressure, temperature and time.

The pressure condition during the polymerisation step may be in the range selected from the group consisting: 1 MPa to 10 MPa; 1 MPa to 5 MPa; and 1.5 MPa to 4 MPa. In one embodiment, the pressure condition during the polymerisation step is about 3 MPa.

The temperature condition during the polymerisation step may be in the range selected from the group consisting: 10° C. to 180° C.; 10° C. to 150° C.; 15° C. to 140° C.; 20° C. to 130° C.; 25° C. to 130° C.; 40° C. to 120° C.; and 50° C. to 110° C. In one embodiment, the temperature condition during the polymerisation step is about 110° C.

The time condition during the polymerisation step may be in the range selected from the group consisting: 1 minute to 40 minutes; 2 minutes to 35 minutes; 3 minutes to 30 minutes; 4 minutes to 25 minutes; 5 minutes to 20 minutes; 5 minutes to 15 minutes; 5 minutes to 10 minutes.

The method may comprise varying one or more of the controlled conditions during polymerising. In one embodiment, the composition may initially be held at about 25° C. and about 3 MPa for about 5 minutes and then subsequently at about 110° C. and about 3 MPa for about 5 minutes.

The method may comprise the further step of allowing the formed one or more polymer imprints to cool to a mold release temperature range before releasing the removing step. The mold release temperature may be in the range selected from the group consisting of: 50° C. to 90° C.; 60° C. to 80°

C.; and 65° C. to 75° C. In one embodiment, the mold release temperature may be about 70° C.

In one embodiment, the polymerising step may comprise radiating the polymerisation medium with radiation. The radiation may be ultraviolet light having a wavelength in the range of about 5 to 400 nanometers.

In one embodiment, the method may comprise the step of partially curing the reaction composition before the step of providing the reaction composition between the defined surface pattern of the mold and the substrate. The step of partially curing may comprise subjecting the reaction composition to radiation, such as ultraviolet light.

The method may comprise the further step of removing residue from the formed one or more polymer imprints. The removing residue step may comprise etching using a plasma gas. Exemplary gasses that may be used include oxygen, halides such as fluorine and chlorine and noble gasses such as argon and mixtures thereof. In one embodiment, the etching is carried out using oxygen or argon.

BEST MODE

Non-limiting examples of the invention, including the best mode, will be further described with reference to the accompanying figures.

FIG. 1 is a schematic diagram of providing a reaction composition between a patterned surface of a mold and a silicon substrate;

FIG. 2 is a schematic diagram of polymerising the reaction composition between the patterned surface of the mold and the silicon substrate under pressure and temperature;

FIG. 3 is a schematic diagram of a formed array of polymer imprints being adhered to the planar substrate being removed from the mold;

FIG. 7A shows an embodiment of multiple nano-imprinted modular polymer support disks;

FIG. 7B shows an embodiment of one of the nano-imprinted modular polymer support disks of FIG. 7A; and FIG. 7C shows close up perspective view of the polymer dots located on the nano-imprinted modular polymer support disk of FIG. 7B.

EXAMPLE 1

Figure 4:
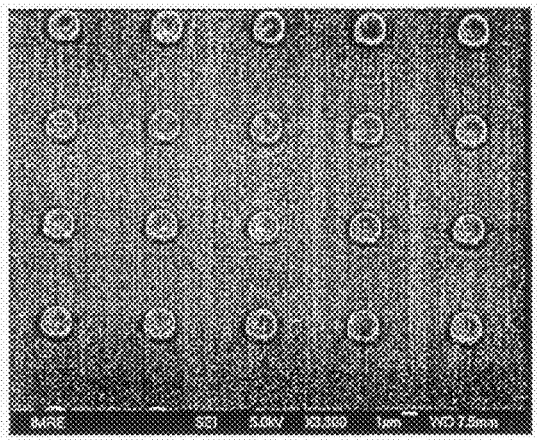
FIG. 4 is a SEM image of a formed array of polymer imprints made according to the disclosed embodiment of example 1.

Functionalised polystyrene nanostructures were imprinted on a silicon wafer to form a Nano Imprinted Modular Support (NIMS).

A polymer reaction composition was prepared by first mixing 60 mol % of styrene monomer with 13 mol % of vinylbenzene chloride and 25 mol % of divinylbenzene as the cross-linking monomer. 2 mol % of benzoyl peroxide free radical initiator was also added.

Curing of the polymer reaction composition was then achieved by radiating with UV light emitted by a UV lamp at a wavelength of 300-400 nm and at an intensity of 30 mW/cm$^2$ for 7 minutes. The transmission of the UV to the polymer reaction composition caused the monomer to partially polymerise and thereby increase the viscosity of the mixture. The pre-cured mixture was then degassed in an ultrasonicator bath.

Referring to FIG. 1, there is shown a silicon mold (12) substrate having a pattern surface (10). The pattern surface (10) was created by photolithography (for feature size >100 nm) or e-beam to produce mold features having a size less than 100 nm. The patterned surface (10) of the mold (12) was treated with 1H,1H,2H,2H-perfluorodecyl-trichlorosilane anti-stiction agent to ensure enhanced mold release after curing. The mold (12) was a silicon substrate and the pattern on the mold was created by photolithography (for feature size >100 nm) or e-beam to produce mold features having a size less than 100 nm.

A layer of the partially cured styrene composition (14) was provided on the patterned surface (10) of the mold (12).

A semiconductor grade, 1 μm thick silicon wafer (16) was treated with oxygen plasma using a sputtering machine to remove organics and to clean it, to thereby providing good adhesion of the polymer to the substrate.

Methacryloxypropyltrimethoxylsilane was applied to the surface of the silicon wafer (16) to further increase the adhesion of the polymer composition to the surface of the silicon wafer (16).

The silicon wafer (16) was then located on top of the partially cured styrene composition (14) as shown in FIG. 9B.

The arrangement shown in FIG. 9B was put into an Obducat 4 inch-NIL Imprinter. The partially cured styrene composition (14) was then imprinted by a reversal imprinting method by applying pressure and raising the temperature as shown by FIG. 9B under the following conditions:

A temperature of 21° C. at 3 MPa gauge pressure for 5 min followed by 110° C. for 5 min at 3 MPa.

During imprinting, the mixture of partially cured styrene composition (14) was further polymerised and crosslinked at 110° C. to form polystyrene. The polystyrene was then allowed to cool to about 70° C. before removal of the mold (12). Upon removal of the mold (12), residue on the substrate was removed using a dry plasma based etch with oxygen.

The polystyrene dots are shown by arrow (14') formed on the silicon wafer (16) to form a polystyrene (PS) nanoimprinted modular support (NIMS). Referring to FIG. 4, there is shown an SEM image of the PS-NIMS. As seen from the SEM image of FIG. 4, the PS-NIMS has a very well defined structure consisting of 1 μm square dots on the silicon wafer (16).

The functionalised PS-NIMS was subjected to solvent testing to determine its resistance to solvents as this is an important requirement for its application as a modular support for solid phase organic synthesis (SPOS). Two batches of PS-NIMS's were immersed in toluene, tetrahydrofuran and water separately at 21° C. for five days (batch A) and at 50° C. for five days (batch B).

Figure 5:
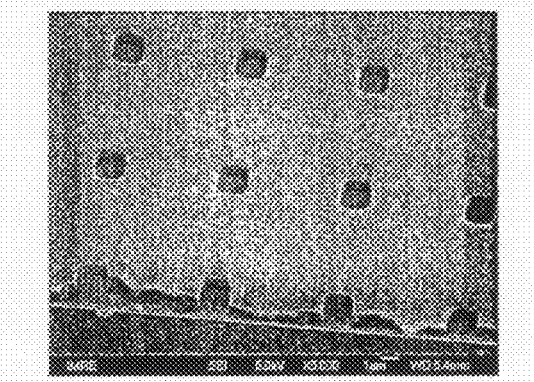
FIG. 5 is an SEM image of the formed array of polymer imprints of example 1 after being immersed in toluene at 21° C. for five days.
Figure 6:
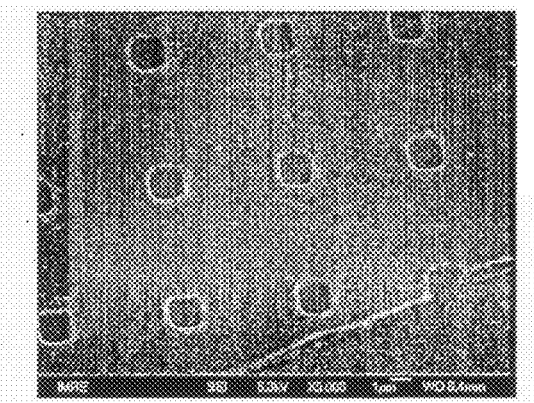
FIG. 6 is an SEM image of the formed array of polymer imprints of example 1 after being immersed in toluene at 50° C. for five days.

No delamination of the PS-NIMS was detected in either batch A or batch B. The SEM images of FIG. 5 for batch A and FIG. 6 for batch B The solution from batches A and B were analysed and it was found that no unreacted chemicals leached from the imprinted polymer.

APPLICATIONS

The nanoimprinted polymer (14') provides a new class of modular support for SPOS.

The disclosed method of producing the nanoimprinted polymer imprints (14') provides a simple, relatively fast and low cost technique compared to other known methods. The disclosed nanoimprinted polymer imprints (14') have well defined shapes and dimensions.

Various functional groups can be introduced on the NIMS during the polymerization step by choosing appropriate co-monomers or by post functional modification, thereby achieving uniform distribution of the functionality of the nanoimprinted polymer imprints (14').

The disclosed imprinted polymer nanostructures offers the advantages of providing a Nano sized array with a well defined structure.

A further advantage is that the swellability of the polymer is no longer a factor in the performance of the solid support during SPOS because tailoring of the surface area and the access of the functional group is achieve through geometry, i.e. the size of the nanoimprinted polymer imprints (14'). Accordingly, the imprint structure (14') is not affected by any organic solvents.

A significantly high surface area is obtainable due to the nano-size of the imprint structure (14').

High functional loading is possible through proper design of the size of the imprints (14') and the spacing between them. As the imprints (14') are precisely spaced, even if the concentration of functional monomer is increased, the site isolation is kept under control.

It is possible for each functional group to be spatially isolated from each other. This permits well defined site isolation between adjacent functionality groups of each imprint structure (14'). This provides the advantage of avoiding competing reactions between molecules (intermolecular) attached to adjacent functional groups.

Referring to FIG. 9A, there is shown multiple nanoimprinted modular polymer support disks (18,20,22,24). FIG. 9B shows a plan view of the nanoimprinted modular polymer support disks 24 of FIG. 9A and FIG. 9C shows a close up of the "dots" (imprint structures (14')). Unlike commercially available grafted modular supports for SPOS, each of the nanoimprinted modular polymer support disks (18,20,22,24) can have various functional groups such as chloromethyl, hydroxymethyl, aldehyde etc. introduced on the imprint structure (14') during the polymerization stage by choosing appropriate co-monomers. As it is possible to tailor the size of the nano-imprint structure (14') (nano dots) say from 10-500 nm, it is also possible to achieve an environment having "one bead one functionality". This "one bead one functionality" is shown in FIG. 9C by dots shown in rows (24a, 24b, 24c, 24d, 24e). Each of the dots shown in rows (24a, 24b, 24c, 24d, 24e) may have a respective functionality with well-defined spacing. As the dots shown in rows (24a, 24b, 24c, 24d, 24e) have a size less than 50 nm, it is possible to have one functionality/dot, thus achieving the 'one bead one functionality' support material, giving rise to a high degree of site isolation and selectivity.

Although the disclosed embodiment of the nanoimprinted polymer (14') is used for SPOS applications, it will be appreciated that the imprinted polymer solid support could be used for applications other than SPOS.

The method for manufacturing the imprinted polymer solid support as disclosed herein could be used to manufacture a catalyst support, devising sensors, medical devices such as diagnostic PCR kits, DNA probe kits/assay chips for genomic expressions and for making micro/nano brushes.

The imprinted crosslinked polymer support could be particularly useful in nano-patterning applications, biological attachment devices (nano adhesion), micro/nano grips, Micro/nano mechanical mirror arrays, and in nano optical devices applications such as high resolution optical lenses.

It will also be appreciated that the polymerization of the disclosed reaction composition can be carried out at relatively low temperatures and pressures compared to other known techniques such as NIL. Additionally, because the reaction composition is polymerised in-situ on the mold, it is not necessary to spin-coat a polymer film on the substrate before it is imprinted on a hard mold surface, which is difficult on flexible substrates such as polymer membranes.

An advantage of polymerising the reaction composition while in contact with the substrate is that it is possible to imprint polymers with various chemical functionalities by incorporating a monomer with one or more specific chemical functional groups or by adding co-monomers with specific chemical functional groups.

In known NIL methods, which operate at elevated temperatures and pressures, the functional groups may be destroyed. A significant advantage over known NIL methods is that by contacting the reaction solution on the surface of the substrate during polymerisation, micro and nano-patterns of cross-linked polymers can be made. Cross-linked polymer, such as cross-linked polystyrene of the disclosed example, could not be imprinted using either NIL or other imprinting methods that form the cross-linked polymer before reverse imprinting, because the cross-linked polymer either has very high $T_g$ or no detectable $T_g$. In the disclosed embodiments, the precursor of the polymer is used as the starting material for imprinting, where the $T_g$ is either very low or there is no $T_g$ in the case of monomeric mixtures, thereby allowing imprinting to be carried out.

It will be apparent that various other modifications and adaptations of the invention will be apparent to the person skilled in the art after reading the foregoing disclosure without departing from the spirit and scope of the invention and it is intended that all such modifications and adaptations come within the scope of the appended claims.

The invention claimed is:

1. A method for forming an imprinted polymer support, the method comprising the steps of:
   providing a substrate and a mold, the mold having a defined surface pattern for defining the shape of one or more polymer imprints;
   providing a first polymerisable medium with at least one functional monomer and a free radical initiator on a first portion of the defined surface pattern of the mold;
   providing a second polymerisable medium with at least one functional monomer that is different from the functional monomer of the first polymerisable medium and a free radical initiator on a second portion of the defined surface pattern of the mold;
   polymerising the polymerisable mediums to form a plurality of polymer imprints;
   contacting the polymerisable mediums on the surface of the substrate during polymerisation to adhere the polymer imprints to the surface of the substrate; and
   separating the mold and the substrate comprising the formed polymer imprints, wherein the polymer imprints confer different functionalities to the substrate.

2. A method as claimed in claim 1, comprising cross-linking the functional monomers.

3. A method as claimed in claim 1, comprising forming an array of polymer imprints on the substrate that are spatially distinct from each other.

4. A method as claimed in claim 1, comprising forming an array of spatially distinct dots on the substrate having a diameter in the range selected from the group consisting of: 5 nm to 1000 nm; 10 nm to 500 nm; 15 nm to 400 nm; 20 nm to 300 nm; 25 nm to 200 nm; 30 nm to 150 nm; and 30 nm to 100 nm.

5. A method as claimed in claim 1, wherein the steps of providing the polymerisable mediums comprise selecting a cross-linking agent.

6. A method as claimed in claim 5, wherein the step of selecting the cross-linking agent comprises selecting an excess amount of cross-linking agent to functional monomer.

7. A method as claim in claim 6, wherein the excess amount of cross-linking agent to functional monomer by weight is selected from the group consisting of: 0.5% to 50%; 1% to 45%; 5% to 40%; 10% to 40%; 15% to 35%; and 20% to 30%.

8. A method as claimed in claim 1, further comprising, after separating the mold from the substrate, the steps of:
- providing additional reaction composition on the defined surface pattern of the mold;
- contacting the additional reaction composition on the surface of the formed polymer imprints adhered to the substrate; and
- polymerising the additional reaction composition to form an additional polymer layer on the surface of the formed polymer imprints.

9. A method as claimed in claim 8, wherein the step of providing additional reaction composition comprises selecting functional monomers in the additional reaction composition that have different functionality to the polymerisable mediums.

10. A method as claimed in claim 1, wherein the steps of providing the polymerisable mediums comprise selecting one or more of an ultra-violet free radical initiator or a thermal free radical initiator.

11. A method as claimed in claim 1, comprising applying an anti-stiction agent onto the defined surface pattern of the mold prior to the polymerising step.

12. A method as claimed in claim 1, comprising applying a plasma gas cleaning agent onto the surface of the substrate prior to the polymerising step.

13. A method as claimed in claim 1, further comprising applying a coupling agent onto the surface of the substrate prior to the polymerising step.

14. A method as claimed in claim 1, comprising controlling one or more of the conditions of the polymerising step selected from the group consisting of: pressure, temperature and time.

15. A method as claimed in claim 14, comprising varying one or more of the controlled conditions during polymerising.

16. A method as claimed in claim 1, comprising partially polymerising the polymerisable mediums before the step of providing the polymerisable mediums on the defined surface pattern of the mold.

17. A method as claimed in claim 1, comprising removing residue between the formed one or more polymer imprints.

* * * * *